(12) United States Patent
Kim et al.

(10) Patent No.: US 6,544,699 B1
(45) Date of Patent: Apr. 8, 2003

(54) METHOD TO IMPROVE ACCURACY OF MODEL-BASED OPTICAL PROXIMITY CORRECTION

(75) Inventors: Hung-Eil Kim, San Jose, CA (US); Carl P. Babcock, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 156 days.

(21) Appl. No.: 09/778,583

(22) Filed: Feb. 7, 2001

(51) Int. Cl.$^7$ ................................................ G03F 9/00
(52) U.S. Cl. ......................................................... 430/30
(58) Field of Search ................................... 430/30, 296

(56) References Cited

U.S. PATENT DOCUMENTS 5,976,741 A * 11/1999 Ziger et al. .................... 430/30
6,156,463 A * 12/2000 Saka ............................. 430/30

* cited by examiner

Primary Examiner—Christopher G. Young
(74) Attorney, Agent, or Firm—Foley & Lardner

(57) ABSTRACT

The disclosure describes an exemplary method of improving the accuracy of model-based optical proximity correction (OPC). This method can include identifying best exposure dose and best focus conditions, measuring critical dimensions at the identified conditions, measuring critical dimensions at variations from the identified conditions, and obtaining critical dimension information by averaging measured critical dimensions.

20 Claims, 1 Drawing Sheet

METHOD TO IMPROVE ACCURACY OF MODEL-BASED OPTICAL PROXIMITY CORRECTION

The present specification relates generally to the field of integrated circuits and to methods of manufacturing and modeling the manufacture of integrated circuits. More particularly, the present specification relates to improving the accuracy of model based optical proximity correction (OPC).

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of devices on an IC, there is still a need to decrease the size of IC device features, and, thus, increase the number of devices on an IC.

One limitation to the smallness of IC critical dimensions is conventional lithography. In general, projection lithography refers to processes for pattern transfer between various media. According to conventional projection lithography, a silicon slice, the wafer, is coated uniformly with a radiation-sensitive film or coating, the photoresist. An exposing source of radiation (such as light, x-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected, it is indelibly formed in the coating. The projected image may be either a negative or a positive image of the subject pattern.

Sub-wavelength lithography places large burdens on lithographic processes. Resolution of anything smaller than a wavelength in any field of wave analysis is quite difficult. Pattern fidelity can deteriorate quite dramatically in sub-wavelength lithography. This deterioration can occur through a combination of effects, including distortions inherent in the formation of the optical image, effects arising from the chemical and physical interaction of the photoresist and developer, and loading variations in the etching process. Alone or in concert, these effects can cause the features as formed to deviate significantly in size and shape from the ideal pattern as drawn by the circuit designer. Circuit performance and chip yield can be significantly affected by these distortions in feature size and placement.

There are many different design rules which give instructions to circuit designers on how to avoid these process regions altogether, by setting minimum sizes for certain features or spaces. Design-rule-checking (DRC) software is used to automatically verify that all IC designs adhere to this set of design rules. However, to continue to obtain smaller dimensions, features must be made smaller than these typical minimum settings.

One solution which purports to be a guide to navigate the non-linearities and distortions in these process regions is called an "optical rules checker" (ORC). The ORC is a software product that evaluates a design for anticipated manufacturability. The chief function of the ORC is to identify problem areas in the design that will lead to performance reduction or yield loss. This identification is done by comparing IC designs with predictions of the corresponding silicon manufacturing results and calculating the edge placement error (EPE) expected. Severe EPE results indicate a design which may have significant fabrication problems.

Two problems of integrated circuit fabrication design are of particular concern. The first is a simple problem of one-dimensional line-width control. In different regions on the chip, depending on the local density of features, gates and interconnect lines that are drawn to be the same nominal dimension have different physical sizes. This inconsistency can, in turn, degrade the overall speed specification and reduce the yield of an IC fabrication process.

The second problem is the pullback of line ends from their nominal position. This is sometimes called a "1.5-D Proximity Problem". When lines do not end where expected, overlap with contacts and vias will be reduced, driving current densities higher and causing possible failures or shorts in the design.

The pattern fidelity problems described above are very repeatable, and can be systematically characterized. An ORC check can describe the magnitude of the problem, but to solve the problem, the design layout must be manipulated using specialized EDA (Electronic Design Automation) software. This correction procedure is generally designated by the abbreviation "OPC". Originally OPC stood for "optical proximity correction", because the most obvious distortions requiring correction were optical in origin. However, the mathematical description of a process can also incorporate effects from several process steps, including photoresist development and etch effects. The initials "OPC" can therefore be more broadly used to represent "optical and process corrections", more accurately reflecting the practice of OPC as it is done today.

Using empirical data, OPC software creates a mathematical description of the process distortions. This description can be in the form of simple shape manipulation rules, or a more detailed and intricate process model. Once this description is generated, automated software changes the shapes of the polygons in the pattern layout files, moving segments of line edges and adding features that compensate the layout for the distortions to come. The critical levels of the photomask set can then be made using these modified, "predistorted" layout designs. When these masks are used to make chips, these predistortions will cancel the process distortions, resulting in better pattern fidelity, higher yield, and enhanced chip performance. This "predistortion" is the core of OPC technology.

The idea of precompensation or pre-distortion is not new to IC lithography, including the use of serifs (fine lines finishing off the main strokes of a letter or geometric shape) and sub-resolution assist features for better pattern fidelity. Global line-width biasing for process compensation and the use of serifs crafted onto line ends in memory cells have been employed to enhance the ability to make these structures. These techniques have not been widely adopted for ICs in general, however, because their reliance on hand-crafted design manipulations made them practical only for addressing specific problems in repeating layouts, such as memory cells.

A more systematic approach to this correction procedure has now become possible with the advent of sophisticated process simulation techniques and modern data manipulation tools. Numerical models for lithographic imaging and semiconductor process simulation have significantly improved in both accuracy and speed in recent years and can now be integrated with an iterative OPC technique. This in turn can be integrated with EDA software techniques for managing large databases of polygons that represent hierarchical IC designs. The result is an efficient OPC tool for layout manipulation that adjusts the design for optimum manufacturability.

OPC corrections can be added in a range of styles or degrees of "aggressiveness" that can be tailored to suit the lithographic problems at hand. For relatively mild problems, the solutions can be described by a simple set of rules for design manipulations, which can be implemented using standard verification tools. For processes with mild distortions, this can be sufficient to address more than 50% of the pattern fidelity problems.

These rules are derived from a set of empirical observations about process behavior, and are usually quite straightforward to implement. However, with real processes, experienced users begin to see variations in the efficacy of these rules depending on the local layout context, due to the influence of nearby layout features or a general local pattern density. They respond by making a more elaborate set of rules, to begin to address each of these special cases, and the descriptions become unwieldy. In this case, a more general description of the process, or process model, becomes the more efficient technique.

For model-based correction, the problems encountered are in fact similar to those generically encountered when an image is transmitted through a distorting medium. The mathematics of such situations has been well characterized for many years. From a number of straightforward measurements using a well-crafted test pattern, general distortion functions that describe the overall process behavior can be produced. These descriptions are quite abstract, and can be generated from empirical measurements alone without specific reference to individual process parameters. With this process model in hand, the edges of the original design polygons in the design can then be adjusted and manipulated until the predictions of edge placement errors using these process models converge. The final layout is then converted to a mask layout, using jogs, biases, serifs, and other pattern manipulations compatible with the mask fabrication process.

Conventional commercialized OPC tools cannot, nevertheless, anticipate or expect bridging patterns and/or line-shortening effects for areas below 0.15 μm design rule. Bridging patterns are closely spaced features on a photoresist pattern that are connected once they are transferred to the IC wafer. Line-shortening occurs when the size of the transferred pattern on the IC wafer is shorter than the pattern on the photoresist. In general, model based OPC utilizes modified aerial image simulation by adding empirical (experimental) data at best exposure dose and at best focus condition. Empirical data, however, includes only limited sample test patterns. As such, model based OPC is only an approximation. Using conventional model based OPC does not prevent critical dimension (CD) measurement error and mask CD error. Thus, inaccuracies of model based OPC can come from the inaccuracy of empirical data and measurements.

In general, empirical data for OPC is generated by the following process. First, an OPC tool finds a best exposure dose and focus condition for target CD and pitch using optimized stepper NA and sigma (partial coherence) condition. Next, the OPC tool measures sample CDs using standard test design, standard test design is dependent on the target CD or target design rule. Based from these sample CDs, an equation or parameters can be created. Such an equation or parameters are dependent on the commercialized OPC tool used by the IC designer.

After empirical data is created, the OPC tool modifies the original aerial image intensity. Based on these modified aerial image intensity contour, pattern deformation (e.g., corner rounding, line-end shortening, bridging, CD bias . . . ) by proximity effect of original design can be corrected. Next, the design corrected by the OPC tool is taped out to the mask shop for fabrication of a reticle. If the target CD on the mask of this reticle is exactly same as target CD using standard test reticle, there will be no problem. But, usually, the mask CD of these two reticles (standard test reticle and OPC reticle) are different.

Thus, the inaccuracy of model based OPC can be a result of (1) the selected exposure dose and focus not being at best condition such that CD measurement data on the wafer is not accurate, (2) there are mask CD errors between the two reticles used in the design process, and/or (3) the model algorithm of each company is not accurate.

Thus, there is a need for a method to improve the accuracy of model based OPC. Further, there is a need to reduce the CD measurement error on an IC wafer. Yet further, there is a need to reduce mask CD errors on a reticle.

SUMMARY OF THE INVENTION

An exemplary embodiment relates to a method of improving the accuracy of model-based optical proximity correction (OPC). This method can include identifying best exposure dose and best focus conditions, measuring critical dimensions at the identified conditions, measuring critical dimensions at variations from the identified conditions, and obtaining critical dimension information by averaging measured critical dimensions.

Another exemplary embodiment relates to a method of improving the critical dimension (CD) measurement error on integrated circuit wafers and mask CD errors on reticles in an integrated circuit fabrication process. This method can include selecting a condition which provides a best exposure dose and a best focus, measuring critical dimensions on an integrated circuit wafer and on a reticle at the selected condition, measuring critical dimensions on the integrated circuit wafer and on the reticle at a different exposure dose than the best exposure dose, measuring critical dimensions on the integrated circuit wafer and on the reticle at a different focus than the best focus, and averaging measured critical dimensions at the selected condition, at the different exposure dose, and at the difference focus.

Another exemplary embodiment relates to a method of improving critical dimension (CD) errors in an integrated circuit fabrication process. This method includes selecting an exposure dose and focus at a best condition and measuring critical dimensions at various exposure dose and focus conditions including the selected exposure dose and focus condition.

Other principle features and advantages will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF EXEMPLARY EMBODIMENTS

Figure 1:
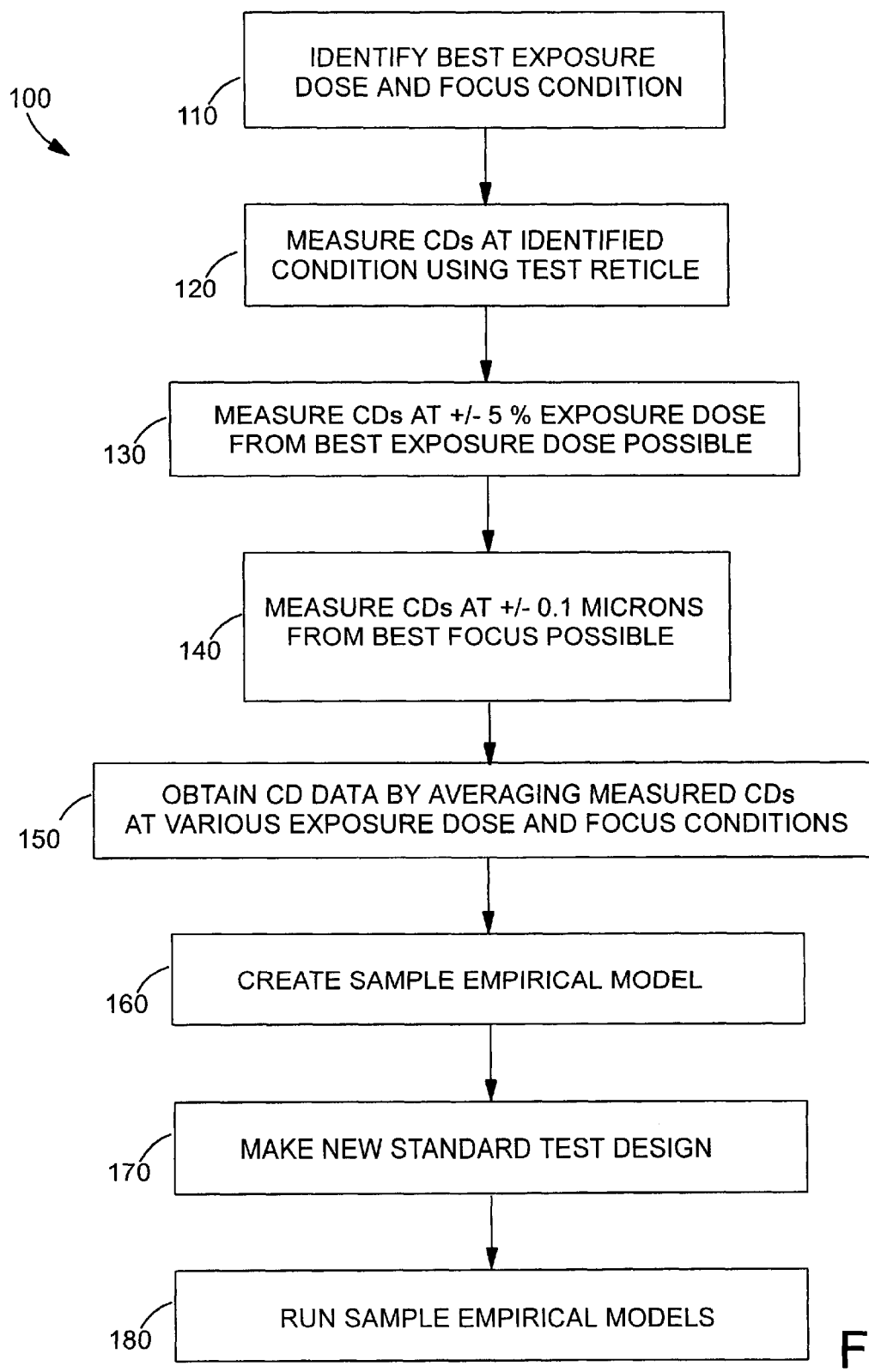
FIG. 1 is a flow diagram illustrating an exemplary method of improving the accuracy of model-based optical proximity correction (OPC).

FIG. 1 illustrates a flow diagram 100 of an exemplary method to improve the CD measurement error on an integrated circuit wafer and mask CD errors on a reticle. In a step 110, a possible best exposure dose and focus condition is found using exposure-focus matrix wafer. An exposure-focus matrix is a printing method on an IC wafer. In an exposure-focus matrix method, an optimum exposure dose/focus is found using a matrix of combinations. In order to find the best exposure dose/focus, each field of the IC wafer is printed with a different dose/focus combination. The optimum dose/focus is found by measuring all possible combinations on the IC wafer. For example, where the wafer center is the 30 mJ and 0.0 $\mu$m combination of dose and focus, dose can be incremented by 2 mJ and focus can be incremented by 0.1 $\mu$m. Table 1 illustrates an exemplary field used in an exposure-focus matrix method.

TABLE 1

| | | | | |
|---|---|---|---|---|
| 26 mJ/–0.2 $\mu$m | 28 mJ/–0.2 $\mu$m | 30 mJ/–0.2 $\mu$m | 32 mJ/ –0.2 $\mu$m | 34 mJ/ –0.2 $\mu$m |
| 26 mJ/–0.1 $\mu$m | 28 mJ/–0.1 $\mu$m | 30 mJ/–0.1 $\mu$m | 32 mJ/ –0.1 $\mu$m | 34 mJ/ –0.1 $\mu$m |
| 26 mJ/0.0 $\mu$m | 28 mJ/0.0 $\mu$m | 30 mJ/0.0 $\mu$m | 32 mJ/ 0.1 $\mu$m | 34 mJ/ 0.0 $\mu$m |
| 26 mJ/0.1 $\mu$m | 28 mJ/0.1 $\mu$m | 30 mJ/0.1 $\mu$m | 32 mJ/ 0.1 $\mu$m | 34 mJ/ 0.1 $\mu$m |
| 26 mJ/0.2 $\mu$m | 28 mJ/0.2 $\mu$m | 30 mJ/0.2 $\mu$m | 32 mJ/ 0.2 $\mu$m | 34 mJ/ 0.2 $\mu$m |

Best exposure dose and focus conditions can be determined by a critical dimension (CD) scanning electron microscope (SEM). Commercialized CD SEMs include Hitachi's S-9200 and KLA-Tancor's KLA 8100XP.

In a step 120, the critical dimensions of feature patterns at this best exposure dose and focus condition are measured using a standard test reticle. In a step 130, the feature pattern critical dimensions are measured at ±5% exposure dose from possible best exposure dose. feature pattern critical dimensions at exposure doses of 28.5 mJ and 31.5 mJ are measured. A CD SEM can be used for such measurement determinations.

In a step 140, the feature pattern critical dimensions at ±0.1 $\mu$m focus from possible best focus are measured. For example, if 0.0 $\mu$m is possible best focus, critical dimensions at +0.1 $\mu$m and –0.1 $\mu$m are measured. Thus, in an exemplary embodiment, five conditions can be measured for exposure dose/best focus. These include 30 mJ/0.0 $\mu$m; 28.5 mJ/0.0 $\mu$m; 31.5 mJ/0.0 $\mu$m; 30 mJ/+0.1 $\mu$m; and 30 mJ/0.1 $\mu$m.

In a step 150, feature pattern critical dimensions data is obtained by averaging the five exposure dose and focus conditions. In a step 160, using this averaged critical dimension data, a sample empirical model is created. In a step 170, a new standard test design is made including: original standard test design, 4% larger critical dimension (CD) design from original, and 4% smaller CD design from original.

In a step 180, a sample empirical model for 4% larger CD design and for 4% smaller CD design is run by running the sample empirical model to these two designs, the possible effects of mask error are checked. In addition, the critical area of mask error effect can be checked. Advantageously, the method described with reference to FIG. 1 improves the critical dimension errors in empirical model and the critical area for mask error effect so that the accuracy of model based OPC can be improved.

In an exemplary embodiment, the method described with reference to FIG. 1 can be implemented using computer software, such as, Mentor Graphic's Calibre and Avant!'s Tauras. Such computer software can be loaded on the critical dimension (CD) scanning electron microscope (SEM) or provided on a computer workstation in communication with the CD SEM.

While the embodiments illustrated in the FIGURES and described above are presently preferred, it should be understood that these embodiments are offered by way of example only. For example, the materials, dimensions, sizes, and equipment mentioned herein is merely exemplary and may be substituted with other such elements in alternative arrangements. The invention is not limited to a particular embodiment, but extends to various modifications, combinations, and permutations that nevertheless fall within the scope and spirit of the appended claims.

What is claimed is:

1. A method of improving the accuracy of model-based optical proximity correction (OPC), the method comprising:

identifying best exposure dose and best focus conditions;

measuring critical dimensions at the identified conditions;

measuring critical dimensions at variations from the identified conditions; and obtaining critical dimension information by averaging measured critical dimensions.

2. The method of claim 1, wherein the step of measuring critical dimensions at variations from the identified conditions comprises measuring critical dimensions at exposure dose conditions which vary by +/–5% from the identified best exposure dose condition.

3. The method of claim 1, wherein the step of measuring critical dimensions at variations from the identified conditions comprises measuring critical dimensions at focus conditions which vary by +/–0.1 $\mu$m from the identified best focus condition.

4. The method of claim 1, further comprising creating a sample empirical model.

5. The method of claim 1, further comprising making a new standard test design.

6. The method of claim 5, wherein the new standard test design includes an original test design, a larger critical dimension (CD) design from the original test design, and a smaller critical dimension (CD) design from the original test design.

7. The method of claim 6, wherein the larger CD design is 4% larger than the original test design.

8. The method of claim 6, wherein the smaller CD design is 4% smaller than the original test design.

9. The method of claim 1, wherein the step of identifying best exposure dose and best focus conditions comprises using an exposure-focus matrix wafer.

10. A method of improving the critical dimension (CD) measurement error on integrated circuit wafers and mask CD errors on reticles in an integrated circuit fabrication process, the method comprising:

selecting a condition which provides a best exposure dose and a best focus;

measuring critical dimensions on an integrated circuit wafer and on a reticle at the selected condition;

measuring critical dimensions on the integrated circuit wafer and on the reticle at a different exposure dose than the best exposure dose;

measuring critical dimensions on the integrated circuit wafer and on the reticle at a different focus than the best focus; and averaging measured critical dimensions at the selected condition, at the different exposure dose, and at the difference focus.

11. The method of claim 10, wherein the different exposure dose is ±5% from the selected best exposure dose.

12. The method of claim 10, wherein the different focus is ±0.01 μm from the selected best focus.

13. The method of claim 10, further comprising providing a sample empirical model from the averaged critical dimensions.

14. The method of claim 13, further comprising providing a new standard test design from the sample empirical model.

15. The method of claim 14, further comprising running the new standard test design for a larger critical dimension design and for a smaller critical dimension design to check possible effects of mask error.

16. A method of improving critical dimension (CD) errors in an integrated circuit fabrication process, the method comprising:

selecting an exposure dose and focus at a best condition; and measuring critical dimensions at various exposure dose and focus conditions including the selected exposure dose and focus condition.

17. The method of claim 16, wherein the step of selecting an exposure dose and focus at a best condition comprises using an exposure-focus matrix wafer.

18. The method of claim 16, further comprising creating a sample empirical model using the measured critical dimensions.

19. The method of claim 18, further comprising running the sample empirical model at a larger critical dimension design.

20. The method of claim 18, further comprising running the sample empirical model at a smaller critical dimension design.

* * * * *